US006353365B1

(12) United States Patent
Barnes

(10) Patent No.: US 6,353,365 B1
(45) Date of Patent: Mar. 5, 2002

(54) CURRENT REFERENCE CIRCUIT

(75) Inventor: William Bryan Barnes, Bristol (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 0 days.

(21) Appl. No.: 09/642,316

(22) Filed: Aug. 21, 2000

(30) Foreign Application Priority Data

Aug. 24, 1999 (GB) ............................................ 9920078

(51) Int. Cl.[7] .................................................. H03F 3/04
(52) U.S. Cl. ........................ 330/288; 330/277; 323/315
(58) Field of Search ................................. 330/277, 288; 323/315, 316

(56) References Cited

U.S. PATENT DOCUMENTS

| | | | | |
|---|---|---|---|---|
| 4,994,688 A | * | 2/1991 | Horiguchi et al. | 307/296.8 |
| 5,949,278 A | | 7/1999 | Oguey | |
| 6,084,391 A | * | 7/2000 | Onodera | 323/315 |
| 6,160,393 A | * | 12/2000 | Ahn et al. | 323/315 |

FOREIGN PATENT DOCUMENTS

| | | | |
|---|---|---|---|
| EP | 0 733 961 | 9/1996 | G05F/3/26 |
| GB | 2 071 953 | 9/1981 | G05F/1/56 |

OTHER PUBLICATIONS

Standard Search Report performed in the corresponding United Kingdom application.

Zhenhua Wang, Two CMOS Large Current–Gain Cells With Linearly Variable Gain and Constant Bandwidth, IEEE Transactions on Circuits and Systems I: Fundamental Theory and Applications, US, IEEE Inc. New York, vol. 39, No. 12 pp. 1021–1024, XP000362832.

* cited by examiner

*Primary Examiner*—Robert Pascal
*Assistant Examiner*—Henry Choe
(74) *Attorney, Agent, or Firm*—Wolf, Greenfield & Sacks, P.C.; James H. Morris; Robert A. Skrivanek, Jr.

(57) ABSTRACT

An integrated current reference circuit uses two current mirror circuits, in which one of the transistors of one of the current mirrors has a back gate connection to the power rail, the drain-source path being connected to the power rail via a voltage offset element.

9 Claims, 1 Drawing Sheet

CURRENT REFERENCE CIRCUIT

FIELD OF THE INVENTION

The present invention relates to an integrated current reference circuit.

BACKGROUND OF THE INVENTION

It is known to provide a constant current generating circuit using two interconnected current mirrors, of which one current mirror is of p FETs and the other is of n FETs. Such circuits have traditionally required one of the branches of the current generator to contain a resistor.

Use of resistors in integrated circuits is not desirable for a number of reasons, for instance because of the temperature dependence thereof, because of the area occupied by a resistor and the difficulty of manufacture.

The present invention therefore aims to at least partly mitigate the difficulties of the prior art.

SUMMARY OF THE INVENTION

According to the present invention there is provided an integrated current reference circuit comprising a first current mirror and a second current mirror, each current mirror having a respective controlling node and a respective controlled node, the controlling node of the first current mirror being connected to the controlled node of the second current mirror and vice-versa, wherein the first current mirror comprises a first FET and a second FET, said first and second FETs each having a respective source, gate and drain terminal, said second FET further having a substrate terminal, the first FET having its gate and drain electrode connected together in common and forming the controlling node of the first current mirror and the second FET having its gate connected in common with the commoned gate and drain of the first FET, and further comprising voltage offset circuitry connecting the source electrodes of the first and second FETs to a supply terminal, the substrate of the first FET being connected to its source and the substrate terminal of the second FET being connected to the supply terminal.

Preferably the second current mirror comprises a first FET and a second FET, the first FET of the second current mirror having a gate and a drain electrode connected together in common and the second FET of the second current mirror having a gate connected to the commoned gate and drain of the first FET of the second current mirror and further comprising an output FET having a gate connected in common to the gate of the second FET of the second current mirror.

Advantageously the first FET of the second current mirror has a smaller current carrying capacity than the second FET of the second current mirror.

Advantageously said first and second FETs of the first current mirror are p FETs and said first and second FETs of the second current mirror are n FETs.

Conveniently said voltage offset circuitry comprises a first offset element connected between the source electrode of the first FET of the first current mirror and said supply terminal and a second offset element connected between the source electrode of the second FET of the first current mirror and said supply terminal.

Preferably said first and second offset elements comprise diode-connected p FETs.

BRIEF DESCRIPTION OF THE DRAWINGS

A preferred embodiment of the present invention will be described, by way of example only, with reference to the accompanying drawings in which.

DESCRIPTION OF THE PREFERRED EMBODIMENT

Figure 1:
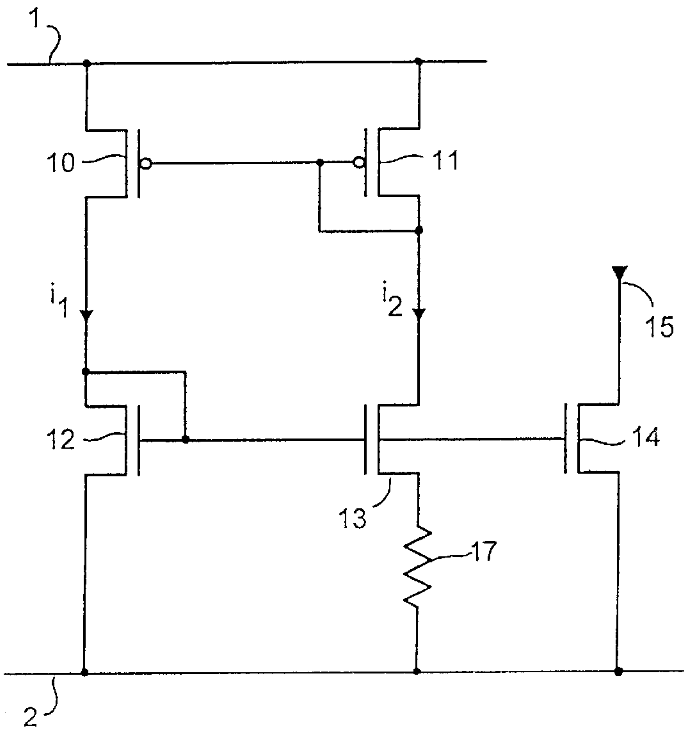
FIG. 1 shows a prior art constant current generating apparatus.

In the various figures like reference numerals refer to like parts.

Referring to FIG. 1, a current reference circuit according to the prior art consists of a first current mirror comprising a first p FET 11 having a gate connected in common with its drain and a source connected to a positive supply terminal 1, and a second p FET 10 having a source connected to the positive supply terminal 1 and a gate connected to the common gate/drain electrodes of the first transistor 11.

The circuit further comprises a second current mirror which consists of a first n FET 12 having a gate electrode connected in common with its drain electrode, and a source electrode connected to a negative supply terminal 2. The second current mirror has a second n FET 13 whose gate is connected to the common gate and drain electrodes of the first n FET 12. The source of the second n FET 13 of the second current mirror is connected via a resistor 17 to the negative supply terminal 2.

The gate electrode of the second n FET 13 is also connected to the gate electrode of an output transistor 14, which has a source electrode connected to the negative supply terminal 2, the drain 15 of the output transistor 14 providing a circuit output.

The common gate and drain electrodes of the first transistor 11 of the first current mirror constitutes a controlling node of that current mirror and the drain of the second transistor 10 of the first current mirror constitutes a controlled node of that current mirror. As is known to those skilled in the art, as the parameters of the transistors 10 and 11 are matched by virtue of their being formed on an integrated circuit, application of a current to the controlling node causes a corresponding current at the controlled node, depending on the relative sizes of the transistors.

Similarly, the common gate and drain electrodes of the first transistor 12 of the second current mirror constitutes a controlling node of the second current mirror whereas the drain of the second transistor 13 of the second current mirror constitutes the controlled node of that transistor.

Further reference to FIG. 1 shows that the controlled node of the first current mirror is connected to the controlling node of the second current mirror and the controlling node of the first current mirror is connected to the controlled node of the second current mirror.

In the arrangement described, the second transistor 13 of the second current mirror is "stronger" than the first transistor 12 of the second current mirror. It will be clear to those skilled in the art that the arrangement shown in FIG. 1 has in fact two stable operating conditions, namely one in which no current flows through either current mirror and a second state in which a non-zero current is sunk by the output terminal 15.

Considering the second stable state, with second n FET 13 having a conductivity which is n times that of the first n FET 12. Naming the current through the controlling transistor 11 of the first current mirror and the controlled transistor 13 of the second current mirror as I2, and the current through the controlled transistor 10 of the first current mirror and the controlling transistor 12 of the second current mirror as I1, the following arise:

The first current mirror constrains the two currents such that $$I1=I2$$

The second current mirror constrains the two currents such that $$I2=n\times I1.$$

Clearly these two constraints alone cannot be satisfied. However, the source potential of the transistor 13 is increased by the current flow through the resistor 17. This reduces the gate-source potential, and thus the ability of transistor 13 to conduct current under the bias conditions provided by the transistor 12.

The result is that the two currents I1 and I2 reach an equilibrium condition at which the two currents become equal and independent of the voltage applied to the circuit.

Figure 2:
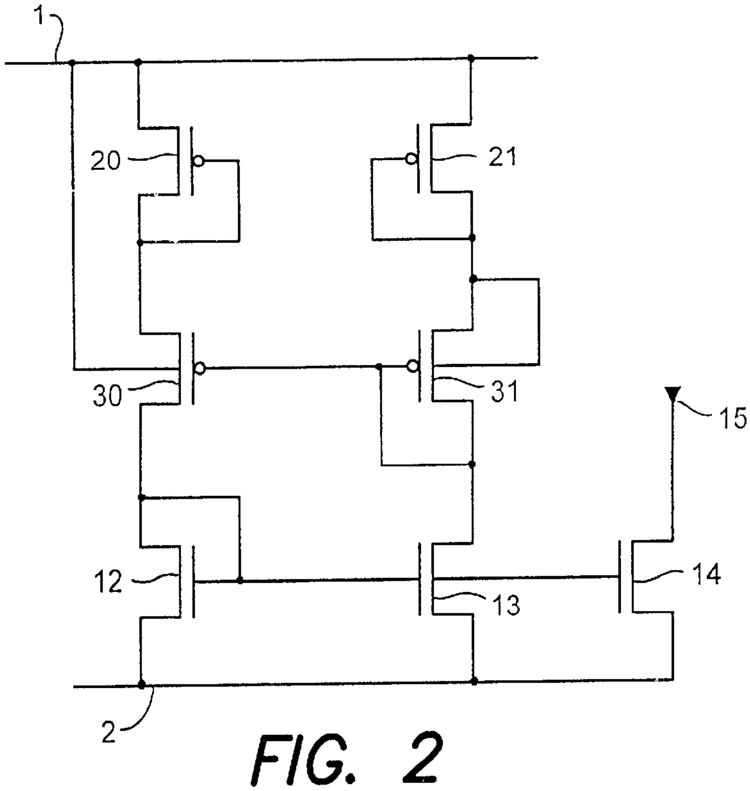
FIG. 2 shows a preferred embodiment of a current reference circuit in accordance with the present invention.

Referring now to FIG. 2, the current reference circuit shown has no resistor in either branch. Thus, the source electrodes of the first transistor 12 and the second transistor 13 of the second current mirror are connected directly to the negative supply terminal 2. The first current mirror comprises a first p FET 31 having its gate connected in common with its drain and a second p FET 30 having a gate connected to the commoned gate and drain terminal of he first p FET 31. The source of the first p FET 31 is connected to the positive supply terminal via a diode-connected p FET 21 and the source of the second p FET 30 of the first current mirror is connected to the positive supply terminal 1 via a second diode-connected p FET 20. The substrate of the first p FET 31 is connected to the source of the first p FET 31 as is conventional; however the substrate of the second p FET 30 is connected to the positive supply terminal 1 so as to provide a so-called "back gate" connection.

As is known to those skilled in the art the provision of a back gate connection to a relatively high potential—here provided by the voltage offset circuitry 20—modifies the threshold voltage of the associated transistor due to the so-called "body effect".

The first p FET 31 of the first current mirror is a relatively small device, whereas the second p FET 30 of the first current mirror is a relatively large device.

As is known to those skilled in the art, the back gate connection of the second p FET 30 requires an additional voltage to be applied to the front (conventional) gate to achieve the same value of current as would be achieved by a similar transistor having a back gate connection to the source. Thus, the threshold voltage of the second p FET 30 is increased.

In operation, the current provided by the first transistor 31 (the smaller transistor) is constrained to be the same as that provided by the second (larger) transistor 30 by the second current mirror comprising transistors 12 and 13. This stabilization occurs because the gate-to-source voltage of the first transistor 31 is effectively opposed by the back gate voltage on the first transistor 30.

What is claimed is:

1. An integrated current reference circuit, comprising:

a first current mirror and a second current mirror, each current mirror having a respective controlling node and a respective controlled node, the controlling node of the first current mirror being connected to the controlled node of the second current mirror and vice-versa, wherein the first current mirror comprises a first FET and a second FET, said first and second FETs each having a respective source, gate and drain terminal, said second FET further having a substrate terminal, the first FET having its gate and drain terminals connected together in common and forming the controlling node of the first current mirror, and the second FET having its gate terminal connected in common with the commoned gate and drain terminals of the first FET; and voltage offset circuitry connecting the source terminals of the first and second FETs to a supply terminal;

wherein the substrate of the first FET is connected to its source terminal; and wherein the substrate terminal of the second FET is directly connected to the supply terminal to modify a threshold voltage of the second FET.

2. The circuit of claim 1 wherein the second current mirror comprises a first FET and a second FET, the first FET of the second current mirror having gate and drain electrodes connected together in common and the second FET of the second current mirror having a gate connected to the commoned gate and drain of the first FET of the second current mirror and further comprising an output FET having a gate connected in common to the gate of the second FET of the second current mirror.

3. The circuit of claim 2 wherein the first FET of the first current mirror has a smaller current carrying capacity than the second FET of the first current mirror.

4. The circuit of claim 2 wherein said first and second FETs of the first current mirror are p FETs and said first and second FETs of the second current mirror are n FETs.

5. The circuit of claim 1, wherein said voltage offset circuitry comprises a first offset element connected between the source terminal of the first FET of the first current mirror and said supply terminal and a second offset element connected between the source terminal of the second FET of the first current mirror and said supply terminal.

6. The circuit of claim 5 wherein said first and second offset elements comprise diode-connected p FETs.

7. The circuit of claim 6, wherein each of said first and second offset elements have their gate terminals connected to their drain terminals and wherein there is no connection between the gate terminals of said respective first and second offset elements.

8. The circuit of claim 1, wherein the substrate terminal of the second FET is connected to the supply terminal to increase the threshold voltage of the second FET.

9. The circuit of claim 1, wherein the second current mirror comprises a first n FET and a second n FET, and wherein the first n FET and the second n FET of the second current mirror are directly connected to the supply terminal.

* * * * *